(12) United States Patent
Chang

(10) Patent No.: US 10,333,542 B2
(45) Date of Patent: Jun. 25, 2019

(54) DIGITAL-TO-ANALOG CONVERTERS HAVING A RESISTIVE LADDER NETWORK

(71) Applicant: SK hynix Inc., Icheon-si, Gyeonggi-do (KR)

(72) Inventor: Keunjin Chang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/996,082

(22) Filed: Jun. 1, 2018

(65) Prior Publication Data

US 2019/0131996 A1  May 2, 2019

(30) Foreign Application Priority Data

Oct. 26, 2017  (KR) .................. 10-2017-0140519

(51) Int. Cl.
*H03M 1/66* (2006.01)
*H03M 1/18* (2006.01)
*H03M 1/44* (2006.01)
*H03M 1/00* (2006.01)
*H03M 1/80* (2006.01)
*H03M 1/78* (2006.01)
*H03M 1/06* (2006.01)

(52) U.S. Cl.
CPC .......... *H03M 1/183* (2013.01); *H03M 1/447* (2013.01); *H03M 1/00* (2013.01); *H03M 1/0646* (2013.01); *H03M 1/66* (2013.01); *H03M 1/785* (2013.01); *H03M 1/80* (2013.01)

(58) Field of Classification Search
CPC ............ H03M 1/66; H03M 1/00; H03M 1/80; H03M 1/0646; H03M 1/785
USPC .................... 341/144, 150, 141, 153, 154
See application file for complete search history.

(56) References Cited

U.S. PATENT DOCUMENTS 4,837,572 A * 6/1989 Gulczynski ............ H03M 1/74
                                                                341/127
4,891,645 A   1/1990 Lewis et al.

* cited by examiner

*Primary Examiner* — Joseph J Lauture
(74) *Attorney, Agent, or Firm* — William Park & Associates Ltd.

(57) ABSTRACT

According to an embodiment, a digital-to-analog converter may be provided. The digital-to-analog converter may include a resistive ladder network including a plurality of paths corresponding to bit currents, respectively. The digital-to-analog converter may include a switching circuit configured to include a plurality of weighted elements respectively coupled to the paths. The digital-to-analog converter may include a reference voltage setting circuit coupled to the weighted elements and the paths, and configured to minimize a variation of threshold voltages of the weighted elements.

23 Claims, 3 Drawing Sheets

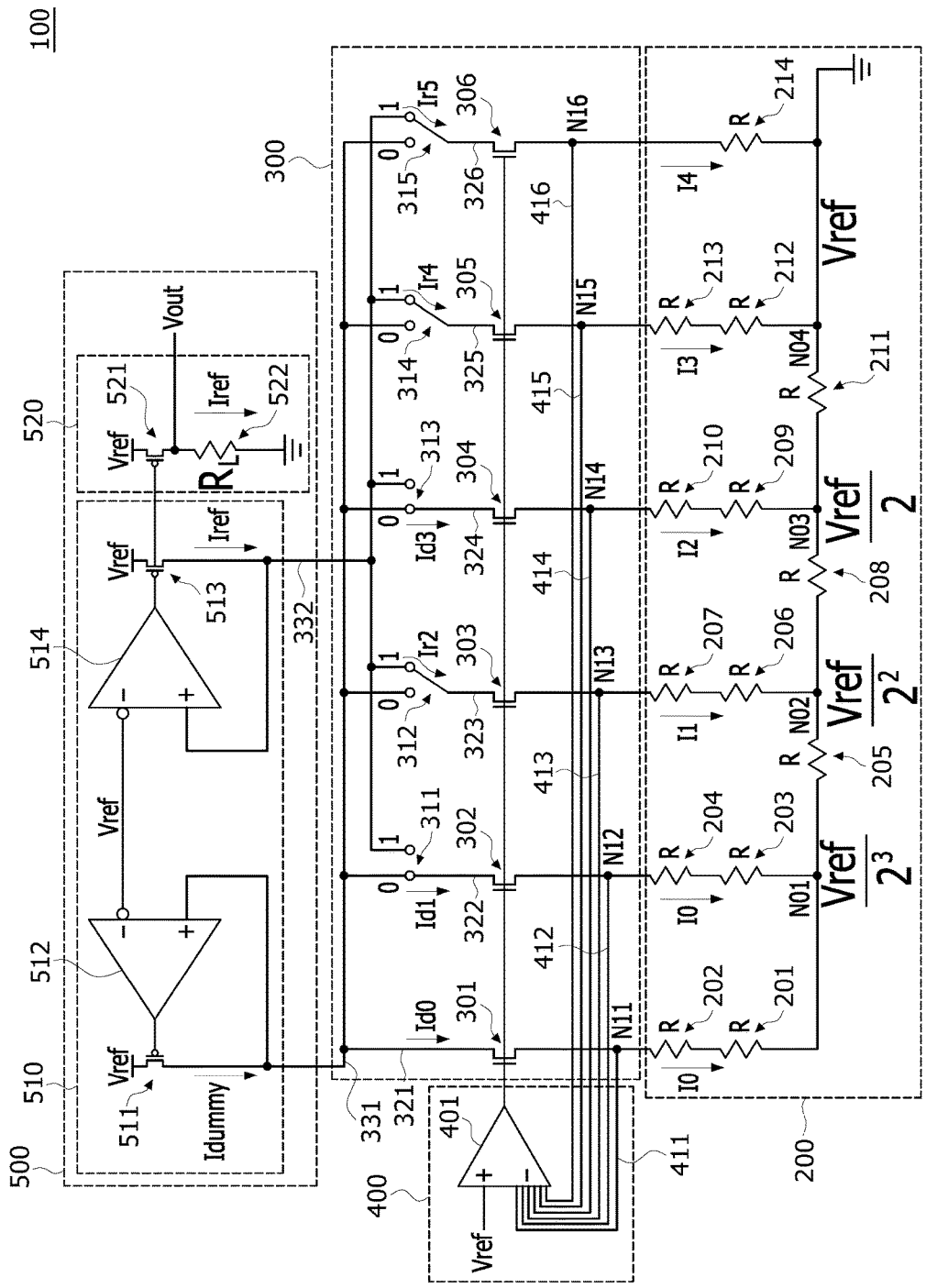

DIGITAL-TO-ANALOG CONVERTERS HAVING A RESISTIVE LADDER NETWORK

CROSS-REFERENCE TO RELATED APPLICATIONS

The present application claims priority under 35 U.S.C 119(a) to Korean Application No. 10-2017-0140519, filed on Oct. 26, 2017, which is herein incorporated by references in its entirety.

BACKGROUND

1. Technical Field

Various embodiments of the present disclosure generally relate to digital-to-analog converters, and more particularly, to digital-to-analog converters having resistive ladder networks.

2. Related Art

Digital-to-analog (DA) converters may covert digital signals corresponding to input signals into analog signals corresponding to output signals. In general, the output signals of the DA converters may be voltage signals having a stepped waveform. If high frequency components of the output voltage signals having the stepped waveform are removed by a filter, it may be possible to obtain analog voltage signals exhibiting a continuously varying voltage level as a function of time. The DA converters may be realized using various kinds of circuit techniques and may be typically categorized as either resistive DA converters employing resistors or capacitive DA converters employing capacitors. In case of the capacitive DA converters, complicate circuits and accurate timing may be required while power consumption is minimized. In contrast, the resistive DA converters may be realized using relatively simple circuits but may consume relatively higher amounts of electric power.

An example of the resistive DA converters may be realized using a binary weighted resistor circuit. According to the binary weighted resistor circuit, a current scaled to be suitable for a binary system may be inputted to an inverting input terminal of an operational amplifier to obtain an analog output voltage which is proportional to a level of a digital signal. However, in such a case, a voltage level of the digital signal should be uniform and resistance values of resistors employed in the resistive DA converter should be accurate even though a conversion speed of the resistive DA converter is relatively fast. In particular, if the number of bits included in the digital signal increases, the number of the resistors having accurate resistance values may also increase. Thus, the resistive DA converters may mainly be used in electronic systems that process digital signals having bits, the number of which is equal to or less than eight.

Another example of the resistive DA converters may be realized using an R-2R ladder network. The R-2R ladder network may be obtained by slightly modifying the binary weighted resistor circuit and may be realized by repeatedly cascading two accurate resistors having different resistance values (i.e., 'R' and '2R') in a ladder shape. Thus, the R-2R ladder network may be free from the restriction that various accurate resistors are required. However, threshold voltages of MOS transistors supplying currents to arms of the R-2R ladder network may vary according to process variation or temperature variation. In such a case, reference voltages induced at the arms of the R-2R ladder network may be out of allowable range of designed values. As a result, the conversion accuracy of the resistive DA converters may be degraded.

SUMMARY

According to an embodiment, a digital-to-analog converter includes an R-2R ladder network, a switching circuit, a reference voltage setting circuit and a current-to-voltage conversion circuit. The R-2R ladder network may include a preliminary path and a plurality of main paths. The switching circuit may include a plurality of weighted elements and a plurality of switching elements. The plurality of weighted elements may be respectively coupled to the preliminary path and the plurality of main paths, and the plurality of switching elements may respectively be coupled to the plurality of weighted elements through the plurality of main paths. The reference voltage setting circuit may be configured to receive an inverting voltage and a non-inverting voltage to generate an output voltage signal applied to gate terminals of the plurality of weighted elements in common. The inverting voltage may have a mean value of reference node voltages induced at the preliminary path and the main paths, and the non-inverting voltage may correspond to a reference voltage. The current-to-voltage conversion circuit may be configured to generate a current flowing through at least one, which may be coupled to a high input line, among the plurality of main paths of the R-2R ladder network. The current-to-voltage conversion circuit may be configured to convert the generated current into a voltage signal and may output the voltage signal.

According to an embodiment, a digital-to-analog converter may be provided. The digital-to-analog converter may include a resistive ladder network including a plurality of paths corresponding to bit currents, respectively. The digital-to-analog converter may include a switching circuit configured to include a plurality of weighted elements respectively coupled to the paths. The digital-to-analog converter may include a reference voltage setting circuit coupled to the weighted elements and the paths, and configured to minimize a variation of threshold voltages of the weighted elements.

BRIEF DESCRIPTION OF THE DRAWINGS

FIG. 3 is a circuit diagram illustrating an operation of the digital-to-analog converter illustrated in FIG. 1.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to digital-to-analog converters having R-2R ladder networks.

Figure 1:
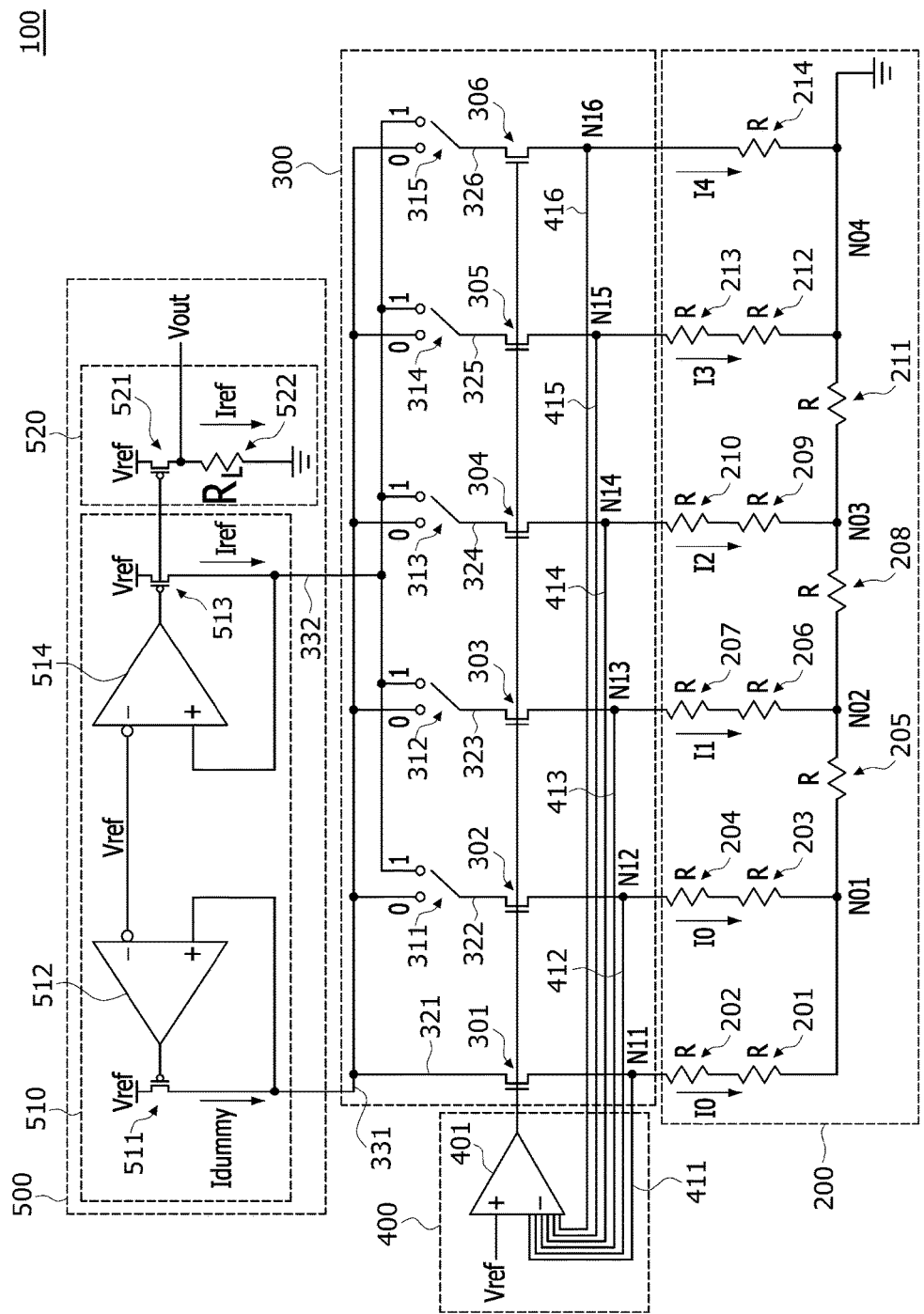
FIG. 1 is a circuit diagram illustrating a digital-to-analog converter according to an embodiment of the present disclosure.

FIG. 1 is a circuit diagram illustrating a digital-to-analog (DA) converter 100 according to an embodiment of the present disclosure. Referring to FIG. 1, the DA converter 100 may receive a digital input signal having first to $N^{th}$ bits to convert the digital signal into an analog output voltage signal Vout. The present embodiment will be described in conjunction with an example in which the digital input signal inputted to the DA converter 100 has five bits. However, the present embodiment may be equally applicable to other DA converters, the digital input signal of which has four or less bits or six or more bits. The DA converter 100 according to the present embodiment may be configured to include a resistive ladder network, for example but not limited to, an R-2R ladder network 200, a switching circuit 300, a reference voltage setting circuit 400 and a current-to-voltage conversion circuit 500.

The R-2R ladder network 200 may be configured to include a plurality of resistors (e.g., first to fourteenth resistors 201~214) which are connected to each other to provide a ladder structure. The first to fourteenth resistors 201~214 may have the same resistance value 'R'. The first and second resistors 201 and 202 may be coupled in series to constitute a preliminary path 321 branching from a first basis node N01. The first and second resistors 201 and 202 coupled in series may provide a first resistive portion having an equivalent resistance value of '2R'. One terminal of the first resistor 201 may be coupled to the first basis node N01. The other terminal of the first resistor 201 may be coupled to one terminal of the second resistor 202. The other terminal of the second resistor 202 may be coupled to a first reference node N11. The first reference node N11 may be coupled to the switching circuit 300 and the reference voltage setting circuit 400. The third and fourth resistors 203 and 204 may be coupled in series to constitute a first main path 322 branching from the first basis node N01. The third and fourth resistors 203 and 204 coupled in series may provide a second resistive portion having an equivalent resistance value of '2R'. One terminal of the third resistor 203 may be coupled to the first basis node N01. The other terminal of the third resistor 203 may be coupled to one terminal of the fourth resistor 204. The other terminal of the fourth resistor 204 may be coupled to a second reference node N12. The second reference node N12 may be coupled to the switching circuit 300 and the reference voltage setting circuit 400. The preliminary path 321 and the first main path 322 may branch from the first basis node N01. That is, the preliminary path 321 and the first main path 322 may be coupled in parallel to the first basis node N01. A first current I0 may flow through each of the preliminary path 321 and the first main path 322, and the first current I0 may be a first bit current that flows through the preliminary path 321 and the first main path 322 and corresponds to a first bit. This first bit may correspond to a least significant bit (LSB). The first basis node N01 may be coupled to a second basis node N02 through the fifth resistor 205. That is, both terminals of the fifth resistor 205 may be directly coupled to the first basis node N01 and the second basis node N02, respectively.

The sixth and seventh resistors 206 and 207 may be coupled in series to constitute a second main path 323 branching from the second basis node N02. The sixth and seventh resistors 206 and 207 coupled in series may provide a third resistive portion having an equivalent resistance value of '2R'. One terminal of the sixth resistor 206 may be coupled to the second basis node N02. The other terminal of the sixth resistor 206 may be coupled to one terminal of the seventh resistor 207. The other terminal of the seventh resistor 207 may be coupled to a third reference node N13. The third reference node N13 may be coupled to the switching circuit 300 and the reference voltage setting circuit 400. A second current I1 may flow through the second main path 323, and the second current I1 may be a second bit current that flows through the second main path 323 and corresponds to a second bit. The second basis node N02 may be coupled to a third basis node N03 through the eighth resistor 208. That is, both terminals of the eighth resistor 208 may be directly coupled to the second basis node N02 and the third basis node N03, respectively.

The ninth and tenth resistors 209 and 210 may be coupled in series to constitute a third main path 324 branching from the third basis node N03. The ninth and tenth resistors 209 and 210 coupled in series may have provide a fourth resistive portion having an equivalent resistance value of '2R'. One terminal of the ninth resistor 209 may be coupled to the third basis node N03. The other terminal of the ninth resistor 209 may be coupled to one terminal of the tenth resistor 210. The other terminal of the tenth resistor 210 may be coupled to a fourth reference node N14. The fourth reference node N14 may be coupled to the switching circuit 300 and the reference voltage setting circuit 400. A third current I2 may flow through the third main path 324, and the third current I2 may be a third bit current that flows through the third main path 324 and corresponds to a third bit. The third basis node N03 may be coupled to a fourth basis node N04 through the eleventh resistor 211. That is, both terminals of the eleventh resistor 211 may be directly coupled to the third basis node N03 and the fourth basis node N04, respectively.

The twelfth and thirteenth resistors 212 and 213 may be coupled in series to constitute a fourth main path 325 branching from the fourth basis node N04. The twelfth and thirteenth resistors 212 and 213 coupled in series may provide a fifth resistive portion having an equivalent resistance value of '2R'. One terminal of the twelfth resistor 212 may be coupled to the fourth basis node N04. The other terminal of the twelfth resistor 212 may be coupled to one terminal of the thirteenth resistor 213. The other terminal of the thirteenth resistor 213 may be coupled to a fifth reference node N15. The fifth reference node N15 may be coupled to the switching circuit 300 and the reference voltage setting circuit 400. A fourth current I3 may flow through the fourth main path 325, and the fourth current I3 may be a fourth bit current that flows through the fourth main path 325 and corresponds to a fourth bit. The fourteenth resistor 214 having an equivalent resistance value of 'R' may be disposed to provide a fifth main path 326 branching from the fourth basis node N04. One terminal of the fourteenth resistor 214 may be coupled to the fourth basis node N04. The other terminal of the fourteenth resistor 214 may be coupled to a sixth reference node N16. The sixth reference node N16 may be coupled to the switching circuit 300 and the reference voltage setting circuit 400. A fifth current I4 may flow through the fifth main path 326, and the fifth current I4 may be a fifth bit current that flows through the firth main path 326 and corresponds to a fifth bit. The fifth bit may correspond to a most significant bit (MSB). The fourth and fifth main paths 325 and 326 may branch from the fourth basis node N04. That is, the fourth and fifth main paths 325 and 326 may be coupled in parallel to the fourth basis node N04. The fourth basis node N04 may be coupled to a ground voltage terminal.

The switching circuit 300 may be configured to include a plurality of weighted elements and a plurality of switching elements (e.g., first to fifth switching elements 311, 312, 313, 314 and 315). In an embodiment, each of the plurality of weighted elements may be an NMOS transistor. The plurality of weighted elements, for example, first to sixth weighted elements 301, 302, 303, 304, 305 and 306 may be disposed in the preliminary path 321 and the first to fifth main paths 322, 323, 324 325 and 326, respectively. Input currents corresponding to weighted values of bits included in the digital input signal may flow through the second to sixth weighted elements 302, 303, 304, 305 and 306, respectively. For example, a current corresponding to a weighted value of a first bit (i.e., the LSB) included in the digital input signal may flow through the second weighted element 302, and a current corresponding to a weighted value of a second bit (i.e., the second LSB) included in the digital input signal may flow through the third weighted element 303. In addition, a current corresponding to a weighted value of a third bit (i.e., the third LSB) included in the digital input signal may flow through the fourth weighted element 304, and a current corresponding to a weighted value of a fourth bit (i.e., the fourth LSB) included in the digital input signal may flow through the fifth weighted element 305. Furthermore, a current corresponding to a weighted value of a fifth bit (i.e., the MSB) included in the digital input signal may flow through the sixth weighted element 306. Accordingly, the second to sixth weighted elements 302, 303, 304, 305 and 306 may have current drivabilities which are different from each other.

For example, the first weighted element 301 may be disposed in the preliminary path 321 providing a reference input line. A drain terminal of the first weighted element 301 may be coupled to the reference input line. A source terminal of the first weighted element 301 may be coupled to the first reference node N11 (i.e., the second resistor 202 of the R-2R ladder network 200) and the reference voltage setting circuit 400. The second weighted element 302 and the first switching element 311 may be coupled in series in the first main path 322. A drain terminal of the second weighted element 302 may be coupled to a first terminal of the first switching element 311. A source terminal of the second weighted element 302 may be coupled to the second reference node N12 (i.e., the fourth resistor 204 of the R-2R ladder network 200) and the reference voltage setting circuit 400. A second terminal of the first switching element 311 may be selectively coupled to a first low input line (providing a binary datum "0") or a first high input line (providing a binary datum "1") according to an operation of the first switching element 311. An operation of the first switching element 311 may be performed according to a binary datum of a first bit (i.e., the LSB) included in the digital input signal.

The third weighted element 303 and the second switching element 312 may be coupled in series in the second main path 323. A drain terminal of the third weighted element 303 may be coupled to a first terminal of the second switching element 312. A source terminal of the third weighted element 303 may be coupled to the third reference node N13 (i.e., the seventh resistor 207 of the R-2R ladder network 200) and the reference voltage setting circuit 400. A second terminal of the second switching element 312 may be selectively coupled to a second low input line (providing a binary datum "0") or a second high input line (providing a binary datum "1") according to an operation of the second switching element 312. An operation of the second switching element 312 may be performed according to a binary datum of a second bit (i.e., the second LSB) included in the digital input signal.

The fourth weighted element 304 and the third switching element 313 may be coupled in series in the third main path 324. A drain terminal of the fourth weighted element 304 may be coupled to a first terminal of the third switching element 313. A source terminal of the fourth weighted element 304 may be coupled to the fourth reference node N14 (i.e., the tenth resistor 210 of the R-2R ladder network 200) and the reference voltage setting circuit 400. A second terminal of the third switching element 313 may be selectively coupled to a third low input line (providing a binary datum "0") or a third high input line (providing a binary datum "1") according to an operation of the third switching element 313. An operation of the third switching element 313 may be performed according to a binary datum of a third bit (i.e., the third LSB) included in the digital input signal.

The fifth weighted element 305 and the fourth switching element 314 may be coupled in series in the fourth main path 325. A drain terminal of the fifth weighted element 305 may be coupled to a first terminal of the fourth switching element 314. A source terminal of the fifth weighted element 305 may be coupled to the fifth reference node N15 (i.e., the thirteenth resistor 213 of the R-2R ladder network 200) and the reference voltage setting circuit 400. A second terminal of the fourth switching element 314 may be selectively coupled to a fourth low input line (providing a binary datum "0") or a fourth high input line (providing a binary datum "1") according to an operation of the fourth switching element 314. An operation of the fourth switching element 314 may be performed according to a binary datum of a fourth bit (i.e., the fourth LSB) included in the digital input signal.

The sixth weighted element 306 and the fifth switching element 315 may be coupled in series in the fifth main path 326. A drain terminal of the sixth weighted element 306 may be coupled to a first terminal of the fifth switching element 315. A source terminal of the sixth weighted element 306 may be coupled to the sixth reference node N16 (i.e., the fourteenth resistor 214 of the R-2R ladder network 200) and the reference voltage setting circuit 400. A second terminal of the fifth switching element 315 may be selectively coupled to a fifth low input line (providing a binary datum "0") or a fifth high input line (providing a binary datum "1") according to an operation of the fifth switching element 315. An operation of the fifth switching element 315 may be performed according to a binary datum of a fifth bit (i.e., the MSB) included in the digital input signal.

As described above, each of the second to sixth weighted elements 302, 303, 304, 305 and 306 may have different current drivabilities, and the first and second weighted elements 301 and 302 may have the same current drivability. The first and second weighted elements 301 and 302 may have a current drivability which is lower than current drivabilities of the third to sixth weighted elements 303, 304, 305 and 306. The third weighted element 303 may have a current drivability which is higher than a current drivability of the second weighted element 302. The fourth weighted element 304 may have a current drivability which is higher than a current drivability of the third weighted element 303.

The fifth weighted element 305 may have a current drivability which is higher than a current drivability of the fourth weighted element 304. The sixth weighted element 306 may have a current drivability which is higher than a current drivability of the fifth weighted element 305. That is, the sixth weighted element 306 may have the highest current drivability among the first to sixth weighted elements 301, 302, 303, 304, 305 and 306. In an embodiment, a current drivability of the third weighted element 303 may be substantially twice a current drivability of the second weighted element 302, and a current drivability of the fourth weighted element 304 may be substantially $2^2$ times a current drivability of the second weighted element 302. In addition, a current drivability of the fifth weighted element 305 may be substantially $2^3$ times a current drivability of the second weighted element 302, and a current drivability of the sixth weighted element 306 may be substantially $2^4$ times a current drivability of the second weighted element 302. Although the present embodiment illustrates an example in which the digital input signal has five bits, the present disclosure may not be limited to the present embodiment. That is, in other embodiments, the number of bits included in the digital input signal may be less than or greater than five. Thus, if the digital input signal has a first bit (i.e., an LSB) to an $N^{th}$ (i.e., an MSB) (where, "N" denotes a natural number which is two or more) and "i" is a natural number which is greater than one and less than "(N+1)", a current drivability of the it weighted element may be substantially twice a current drivability of the $(i-1)^{th}$ weighted element. As described above, the weighted elements 301~306 may be realized using NMOS transistors, each of which has a channel width and a channel length. In such a case, the current drivability of each of the weighted elements may be proportional to a ratio of the channel width to the channel length.

The first to fifth low input lines (providing a binary datum "0") and the reference input line (i.e., the preliminary path 321) disposed in the switching circuit 300 may be coupled to a first input line 331 in common. Thus, a current flowing through the first input line 331 may be divided into a plurality of currents that flow through the first to fifth low input lines (providing a binary datum "0") and the preliminary path 321. Whether currents flow through the first to fifth low input lines (providing a binary datum "0") or not may be determined according to operations of the first to fifth switching elements 311, 312, 313, 314 and 315. The first to fifth high input lines (providing a binary datum "1") may be coupled to a second input line 332 in common. Thus, a current flowing through the second input line 332 may be divided into a plurality of currents that flow through the first to fifth high input lines (providing a binary datum "1"). Whether currents flow through the first to fifth high input lines (providing a binary datum "1") or not may be determined according to operations of the first to fifth switching elements 311, 312, 313, 314 and 315.

The reference voltage setting circuit 400 may be configured to include a first operational amplifier 401. A reference voltage Vref may be applied to a non-inverting input terminal (+) of the first operational amplifier 401. An inverting input terminal (−) of the first operational amplifier 401 may receive voltage signals of the first to sixth reference nodes N11~N16 that respectively connect the first to sixth weighted elements 301, 302, 303, 304, 305 and 306 to the second, fourth, seventh, tenth, thirteenth and fourteenth resistors 202, 204, 207, 210, 213 and 214. That is, a first voltage application line 411 branching from the first reference node N11 in the preliminary path 321 may be coupled to the inverting input terminal (−) of the first operational amplifier 401 to provide a first feedback loop, and a second voltage application line 412 branching from the second reference node N12 in the first main path 322 may be coupled to the inverting input terminal (−) of the first operational amplifier 401 to provide a second feedback loop. In addition, a third voltage application line 413 branching from the third reference node N13 in the second main path 323 may be coupled to the inverting input terminal (−) of the first operational amplifier 401 to provide a third feedback loop, and a fourth voltage application line 414 branching from the fourth reference node N14 in the third main path 324 may be coupled to the inverting input terminal (−) of the first operational amplifier 401 to provide a fourth feedback loop. Moreover, a fifth voltage application line 415 branching from the fifth reference node N15 in the fourth main path 325 may be coupled to the inverting input terminal (−) of the first operational amplifier 401 to provide a fifth feedback loop, and a sixth voltage application line 416 branching from the sixth reference node N16 in the fifth main path 326 may be coupled to the inverting input terminal (−) of the first operational amplifier 401 to provide a sixth feedback loop. An output terminal of the first operational amplifier 401 may be coupled to all of gate terminals of the first to sixth weighted elements 301~306 included in the switching circuit 300.

The current-to-voltage conversion circuit 500 may be configured to include a current generation circuit 510 and an output circuit 520. The current generation circuit 510 may include a dummy current generation circuit and a reference current generation circuit. The dummy current generation circuit may be configured to include a first PMOS transistor 511 and a second operational amplifier 512. The reference current generation circuit may be configured to include a second PMOS transistor 513 and a third operational amplifier 514. The output circuit 520 may be configured to include a third PMOS transistor 521 and a load resistor 522.

The reference voltage Vref may be applied to source terminals of the first and second PMOS transistors 511 and 513 included in the current generation circuit 510. A gate terminal of the first PMOS transistor 511 may be coupled to an output terminal of the second operational amplifier 512. A gate terminal of the second PMOS transistor 513 may be coupled to an output terminal of the third operational amplifier 514. A drain terminal of the first PMOS transistor 511 may be coupled to the first input line 331 and a non-inverting input terminal (+) of the second operational amplifier 512. A drain terminal of the second PMOS transistor 513 may be coupled to the second input line 332 and a non-inverting input terminal (+) of the third operational amplifier 514. An inverting input terminal (−) of the second operational amplifier 512 may be coupled to an inverting input terminal (−) of the third operational amplifier 514.

A dummy current Idummy may flow through the first PMOS transistor 511 and the first input line 331. The dummy current Idummy may be divided into a first current flowing through the reference input line (i.e., the preliminary path 321) and a second current flowing through the first to fifth low input lines (providing a binary datum "0"). If all of the second terminals of the first to fifth switching elements 311, 312, 313, 314 and 315 are respectively coupled to all of the first to fifth high input lines (providing a binary datum "1"), the second current may not flow. In such a case, an amount of the first current flowing through the reference input line (i.e., the preliminary path 321) may have a constant value. In contrast, an amount of the second current flowing through the first to fifth low input lines (providing a binary datum "0") may be determined according to operations of the first to fifth switching elements 311, 312, 313, 314 and 315. A reference current Iref may flow through the second PMOS transistor 513 and the second input line 332. The reference current Iref flowing through second input line 332 may be divided into a plurality of currents flowing through the first to fifth high input lines (providing a binary datum "1") if all of the first to fifth high input lines (providing a binary datum "1") are respectively coupled to all of the first to fifth switching elements 311, 312, 313, 314 and 315. An amount of the reference current Iref flowing through the first to fifth high input lines (providing a binary datum "1") may be determined according to operations of the first to fifth switching elements 311, 312, 313, 314 and 315.

The reference voltage Vref may be applied to a source terminal of the third PMOS transistor 521 included in the output circuit 520. A drain terminal of the third PMOS transistor 521 may be coupled to one terminal of the load resistor 522. The other terminal of the load resistor 522 may be coupled to the ground voltage terminal. The load resistor 522 may have a constant resistance value '$R_L$'. A gate terminal of the third PMOS transistor 521 may be coupled to a gate terminal of the second PMOS transistor 513 included in the current generation circuit 510. Thus, the second and third PMOS transistors 513 and 521 may constitute a current mirror circuit. That is, a current having the same amount as the reference current Iref flowing through the second PMOS transistor 513 may also flow through the third PMOS transistor 521. A drain terminal of the third PMOS transistor 521 may correspond to an output terminal of the output circuit 520. The analog output voltage signal Vout of the DA converter 100 may be outputted through the output terminal of the output circuit 520.

Figure 2:
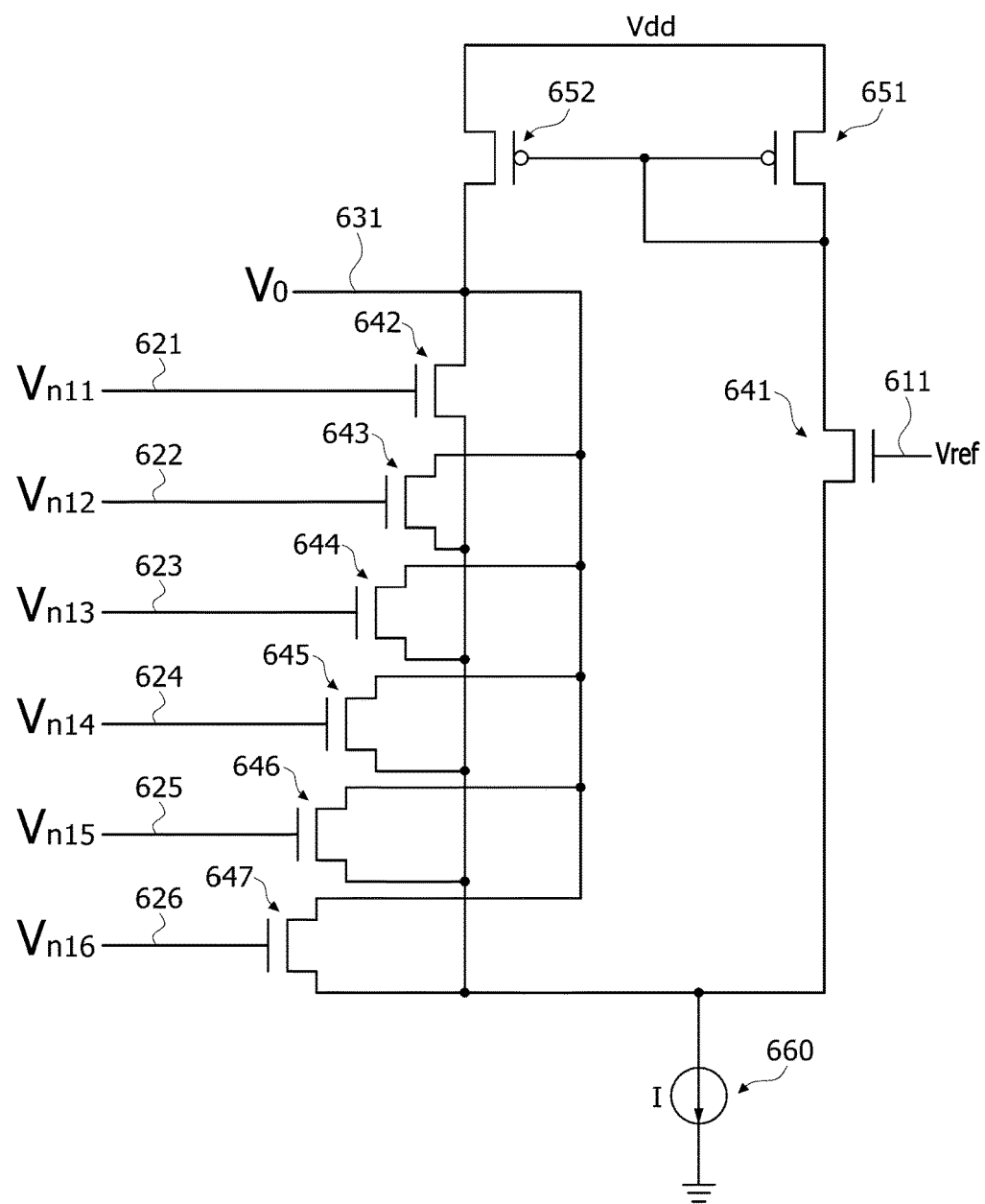
FIG. 2 is a circuit diagram illustrating a first operational amplifier included in the digital-to-analog converter of FIG. 1.

FIG. 2 is a circuit diagram illustrating an internal configuration of the first operational amplifier 401 included in the DA converter 100 of FIG. 1. Referring to FIG. 2, the first operational amplifier 401 may include a non-inverting input line 611, a plurality of inverting input lines (e.g., first to sixth inverting input lines 621~626) and an output line 631. The non-inverting input line 611 may receive the reference voltage Vref through the non-inverting input terminal (+) of the first operational amplifier 401. A plurality of reference node voltages (e.g., first to sixth reference node voltages Vn11~Vn16) may be inputted to the first operational amplifier 401 through the first to sixth inverting input lines 621-626, respectively. An output voltage signal Vo of the first operational amplifier 401 may be outputted through the output line 631.

The non-inverting input line 611 may be coupled to a gate terminal of a first NMOS transistor 641. A drain terminal of the first NMOS transistor 641 may be coupled to a drain terminal of a first PMOS transistor 651. A source terminal of the first NMOS transistor 641 may be coupled to one terminal of a current source 660. The other terminal of the current source 660 may be coupled to the ground voltage terminal. The first PMOS transistor 651 and a second PMOS transistor 652 may constitute a current mirror circuit. For example, a gate terminal of the first PMOS transistor 651 may be coupled to a gate terminal of the second PMOS transistor 652, and source terminals of the first and second PMOS transistors 651 and 652 may be coupled to a power supply voltage Vdd terminal in common. In addition, a gate terminal and a drain terminal of the first PMOS transistor 651 may be coupled to each other.

The first to sixth inverting input lines 621~626 may be coupled to second to seventh NMOS transistors 642~647, respectively. For example, the first inverting input line 621 to which the first reference node voltage Vn11 is applied may be coupled to a gate terminal of the second NMOS transistor 642, and the second inverting input line 622 to which the second reference node voltage Vn12 is applied may be coupled to a gate terminal of the third NMOS transistor 643. In addition, the third inverting input line 623 to which the third reference node voltage Vn13 is applied may be coupled to a gate terminal of the fourth NMOS transistor 644, and the fourth inverting input line 624 to which the fourth reference node voltage signal Vn14 is applied may be coupled to a gate terminal of the fifth NMOS transistor 645. Furthermore, the fifth inverting input line 625 to which the fifth reference node voltage Vn15 is applied may be coupled to a gate terminal of the sixth NMOS transistor 646, and the sixth inverting input line 626 to which the sixth reference node voltage Vn16 is applied may be coupled to a gate terminal of the seventh NMOS transistor 647. Drain terminals of the second to seventh NMOS transistor 642~647 may be coupled to the output line 631 in common, and the output line 631 may be coupled to a drain terminal of the second PMOS transistor 652. Source terminals of the first to seventh NMOS transistors 641~647 may be coupled to the one terminal of the current source 660 in common.

In the present embodiment, the second to seventh NMOS transistors 642~647 may have the same current drivability, and a sum of the current drivabilities of the second to seventh NMOS transistors 642~647 may be substantially equal to a current drivability of the first NMOS transistor 641. A current drivability of each of the first to seventh NMOS transistors 641~647 may be proportional to a size of each NMOS transistor. A size of each NMOS transistor may be defined as a ratio of a channel width to a channel length thereof. For example, if the first NMOS transistor 641 has a size of 'A(=W÷L)' (where, 'W' denotes a channel width of the first NMOS transistor 641 and 'L' denotes a channel length of the first NMOS transistor 641), each of the second to seventh NMOS transistors 642~647 may have a size 'A÷6'.

Hereinafter, an operation of the first operational amplifier 401 will be described with reference to FIGS. 1 and 2. A voltage level of the output voltage signal Vo outputted through the output line 631 of the first operational amplifier 401 may be applied to all of gate terminals of the first to sixth weighted elements 301~306 included in the switching circuit 300. In addition, the reference voltage Vref may be applied to a gate terminal of the first NMOS transistor 641 through the non-inverting input line 611 of the first operational amplifier 401. The first to sixth reference node voltages Vn11~Vn16, which are respectively induced at the first to sixth reference nodes N11~N16, may be applied to the first to sixth inverting input lines 621~626, respectively. The first to sixth reference node voltages Vn11~Vn16 may be applied to gate terminals of the second to seventh NMOS transistors 642~647, respectively.

For example, the first reference node voltage Vn11 induced at the first reference node N11 may be applied to a gate terminal of the second NMOS transistor 642 through the first inverting input line 621, and the second reference node voltage Vn12 induced at the second reference node N12 may be applied to a gate terminal of the third NMOS transistor 643 through the second inverting input line 622. In addition, the third reference node voltage Vn13 induced at the third reference node N13 may be applied to a gate terminal of the fourth NMOS transistor 644 through the third inverting input line 623, and the fourth reference node voltage Vn14 induced at the fourth reference node N14 may be applied to a gate terminal of the fifth NMOS transistor 645 through the fourth inverting input line 624. Furthermore, the fifth reference node voltage Vn15 induced at the fifth reference node N15 may be applied to a gate terminal of the sixth NMOS transistor 646 through the fifth inverting input line 625, and the sixth reference node voltage Vn16 induced at the sixth reference node N16 may be applied to a gate terminal of the seventh NMOS transistor 647 through the sixth inverting input line 626.

The first reference node voltage Vn11 induced at the first reference node N11 may correspond to a voltage induced at a source terminal of the first weighted element 301 and may have a voltage level that remains after subtracting a threshold voltage (i.e., a first threshold voltage) of the first weighted element 301 from a voltage difference between a gate terminal and a source terminal of the first weighted element 301. The second reference node voltage Vn12 induced at the second reference node N12 may correspond to a voltage induced at a source terminal of the second weighted element 302 and may have a voltage level that remains after subtracting a threshold voltage (i.e., a second threshold voltage) of the second weighted element 302 from a voltage difference between a gate terminal and a source terminal of the second weighted element 302. The third reference node voltage Vn13 induced at the third reference node N13 may correspond to a voltage induced at a source terminal of the third weighted element 303 and may have a voltage level that remains after subtracting a threshold voltage (i.e., a third threshold voltage) of the third weighted element 303 from a voltage difference between a gate terminal and a source terminal of the third weighted element 303. The fourth reference node voltage Vn14 induced at the fourth reference node N14 may correspond to a voltage induced at a source terminal of the fourth weighted element 304 and may have a voltage level that remains after subtracting a threshold voltage (i.e., a fourth threshold voltage) of the fourth weighted element 304 from a voltage difference between a gate terminal and a source terminal of the fourth weighted element 304. The fifth reference node voltage Vn15 induced at the fifth reference node N15 may correspond to a voltage induced at a source terminal of the fifth weighted element 305 and may have a voltage level that remains after subtracting a threshold voltage (i.e., a fifth threshold voltage) of the fifth weighted element 305 from a voltage difference between a gate terminal and a source terminal of the fifth weighted element 305. The sixth reference node voltage Vn16 induced at the sixth reference node N16 may correspond to a voltage induced at a source terminal of the sixth weighted element 306 and may have a voltage level that remains after subtracting a threshold voltage (i.e., a sixth threshold voltage) of the sixth weighted element 306 from a voltage difference between a gate terminal and a source terminal of the sixth weighted element 306.

If the first to sixth weighted elements 301~306 have the same threshold voltage, the first to sixth reference node voltages Vn11~Vn16 may have the same voltage level. In such a case, since the second to seventh NMOS transistors 642~647 have the same size, the first to sixth reference node voltages Vn11~Vn16 may have the same voltage level. A voltage level of the output voltage signal Vo of the first operational amplifier 401 may be controlled such that the first to sixth reference node voltages Vn11~Vn16 applied to the inverting input terminal (−) are equal to the reference voltage Vref applied to the non-inverting input terminal (+). The output voltage signal Vo of the first operational amplifier 401 may be applied to all of gate terminals of the first to sixth weighted elements 301~306 to turn on the first to sixth weighted elements 301~306.

If at least two of the threshold voltages of the first to sixth weighted elements 301~306 are different from each other, at least two of the first to sixth reference node voltages Vn11~Vn16 may be different from each other. This is because the first to sixth weighted elements 301~306 are formed to have different sizes or different material properties due to non-uniformity of various fabrication processes. In such a case, an average voltage having a mean value of the first to sixth reference node voltages Vn11~Vn16 may be applied to the inverting input terminal (−) of the first operational amplifier 401. A voltage level of the output voltage signal Vo of the first operational amplifier 401 may be controlled such that an average voltage of the first to sixth reference node voltages Vn11~Vn16 is equal to the reference voltage Vref applied to the non-inverting input terminal (+). If at least two of the threshold voltages of the first to sixth weighted elements 301~306 are different from each other, the output voltage signal Vo of the first operational amplifier 401 may be controlled to minimize a variation of the threshold voltages of the first to sixth weighted elements 301~306. The output voltage signal Vo of the first operational amplifier 401 may be applied to all of gate terminals of the first to sixth weighted elements 301~306 to turn on the first to sixth weighted elements 301~306.

FIG. 3 is a circuit diagram illustrating an operation of the DA converter 100 illustrated in FIG. 1. The operation of the DA converter 100 will be described hereinafter in conjunction with an example in which the digital input signal having binary data of '11010' is inputted to the DA converter 100. Referring to FIG. 3, since a first bit (corresponding to an LSB) of the digital input signal has a logic "low(0)" level, the second terminal of the first switching element 311 included in the switching circuit 300 may be coupled to the first low input terminal (providing a binary datum "0"). Since a second bit of the digital input signal has a logic "high(1)" level, the second terminal of the second switching element 312 included in the switching circuit 300 may be coupled to the second high input terminal (providing a binary datum "1"). Since a third bit of the digital input signal has a logic "low(0)" level, the second terminal of the third switching element 313 included in the switching circuit 300 may be coupled to the third low input terminal (providing a binary datum "0"). Since a fourth bit of the digital input signal has a logic "high(1)" level, the second terminal of the fourth switching element 314 included in the switching circuit 300 may be coupled to the fourth high input terminal (providing a binary datum "1"). Since a fifth bit (corresponding to an MSB) of the digital input signal has a logic "high(1)" level, the second terminal of the fifth switching element 315 included in the switching circuit 300 may be coupled to the fifth high input terminal (providing a binary datum "1").

As described above, current paths in the switching circuit 300 may be determined by operations of the first to fifth switching elements 311~315. For example, the dummy current Idummy flowing through the first input line 331 may be divided into a current Id0 flowing through the reference input line (i.e., the preliminary path 321), a current Id1 flowing through the first low input line, and a current Id3 flowing through the third low input line. Since the first and second weighted elements 301 and 302 have the same current drivability, amount of the current Id0 flowing through the reference input line (i.e., the preliminary path 321) may be substantially equal to an amount of the current Id1 flowing through the first low input line. In contrast, since a current drivability of the fourth weighted element 304 is substantially $2^2$ times a current drivability of the second weighted element 302, an amount of the current Id3 flowing through the third low input line may be $2^2$ times an amount of the current Id1 flowing through the first low input line.

Meanwhile, the reference current Iref flowing through the second input line 332 may be expressed by the following equation 1.

$$Iref = \sum_{n=0}^{4} Mn(Ir \times 2^n) \qquad \text{(Equation 1)}$$

In the equation 1, "Mn" denotes a value of the digital input signal and "Ir" denotes the current Id0 flowing through the first weighted element 301 having a reference current drivability. In the present embodiment, since the first bit (i.e., the LSB) and the third bit of the digital input signal have a logic "low(0)" level, "Mn" may have a value of zero if "n" is zero or two. Thus, "Mn(Ir×$2^n$)" may have a value of zero if "n" is zero or two. In contrast, since the second bit, the fourth bit and the fifth bit (i.e., the MSB) of the of the digital input signal have a logic "high(1)" level, "Mn" may have a value of "1" if "n" is one, three or four. Thus, "Mn(Ir×$2^n$)" may have a value of "2Ir" if "n" is one, "Mn(Ir×$2^n$)" may have a value of "8Ir" if "n" is three, and "Mn(Ir×$2^n$)" may have a value of "16Ir" if "n" is four. Since the second switching element 312, the fourth switching element 314 and the fifth switching element 315 are respectively coupled to the second high input line, the fourth high input line and the fifth high input line, the reference current Iref flowing through the second input line may be divided into a current Ir2 flowing through the second high input line, a current Ir4 flowing through the fourth high input line, and a current Ir5 flowing through the fifth high input line.

Since a current drivability of the third weighted element 303 is twice a current drivability of the first weighted element 301, the current Ir2 flowing through the third weighted element 303 and the second main path 323 may have an amount of "2×Id0" which is twice an amount of the current Id0 flowing through the first weighted element 301. In addition, since a current drivability of the fifth weighted element 305 is eight (=$2^3$) times a current drivability of the first weighted element 301, the current Ir4 flowing through the fifth weighted element 305 and the fourth main path 325 may have an amount of "8×Id0" which is eight (=$2^3$) times an amount of the current Id0 flowing through the first weighted element 301. Moreover, since a current drivability of the sixth weighted element 306 is sixteen (=$2^4$) times a current drivability of the first weighted element 301, the current Ir5 flowing through the sixth weighted element 306 and the fifth main path 326 may have an amount of "16×Id0" which is sixteen (=$2^4$) times an amount of the current Id0 flowing through the first weighted element 301.

As described above, the currents Id0, Id1, Ir2, Id3, Ir4 and Ir5 flowing through the preliminary path 321 and the first to fifth main paths 322~325 may be drained into the ground voltage terminal through the R-2R ladder network 200. Thus, the currents Id0, Id1, Ir2, Id3, Ir4 and Ir5 may be calculated using the resistance values 'R' of the plurality of resistors 201~214 constituting the R-2R ladder network 200 and a voltage drop across each of the plurality of resistors 201~214. For example, if the first to sixth reference node voltages Vn11~Vn16 respectively induced at the first to sixth reference nodes N11~N16 are equal to each other to have a reference node voltage Vn, a voltage induced at the first basis node N01 may be expressed by "Vn÷$2^3$", a voltage induced at the second basis node N02 may be expressed by "Vn÷$2^2$", a voltage induced at the third basis node N03 may be expressed by "Vn÷2", and a voltage induced at the fourth basis node N04 may be expressed by "Vn". Thus, the current Ir2 flowing through the second main path 323 may be expressed by "Vn÷($2^3$R)", the current Ir4 flowing through the fourth main path 325 may be expressed by "Vn÷(2R)", and the current Ir5 flowing through the fifth main path 326 may be expressed by "Vn÷R". Accordingly, the current IrN flowing through an $N^{th}$ main path corresponding to the $N^{th}$ bit of the digital input signal may be expressed by the following equation 2.

$$IrN = Vn/(2^{M-1} \times R) \qquad \text{(Equation 2)}$$

In the equation 2, "Vn" denotes a reference node voltage and "M" has any one among natural numbers from one to N to indicate positions of bits included in the digital input signal.

If the currents flowing through the various paths in the R-2R ladder network 200 are calculated, the reference current Iref flowing through the output circuit 520 may be expressed by the following equation 3.

$$Iref = \sum_{n=0, M=N}^{N-1, 1} \{(Vn \times 2^n)/(2^{M-1} \times R)\} \qquad \text{(Equation 3)}$$

If the reference current Iref flowing through the output circuit 520 is determined by the equation 3, the analog output voltage signal Vout corresponding to the output voltage signal of the output circuit 520 may have a magnitude of "RL×Iref".

As described with reference to FIG. 2, even though the threshold voltages of the first to sixth weighted elements 301~306 are not uniform, the first to sixth reference node voltages Vn11~Vn16 of the first to sixth reference nodes N11~N16 may be transmitted through the inverting input lines 621~626 and the first to sixth reference node voltages Vn11~Vn16 may be applied to the gate terminals of the second to seventh NMOS transistors 642~647 which are designed to have the same current drivability in the first operational amplifier 401. Accordingly, the output voltage signal Vo of the first operational amplifier 401 may be controlled to have a mean value of the first to sixth reference node voltages Vn11~Vn16. Thus, even though at least two of the first to sixth reference node voltages Vn11~Vn16 are different from each other, it may be possible to prevent the conversion accuracy of the DA converter 100 from being degraded.

The digital-to-analog converters as discussed above (see FIGS. 1-3 and related descriptions) are particular useful in the design of other memory devices, processors, and computer systems. The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A digital-to-analog converter comprising:
an R-2R ladder network including a preliminary path and a plurality of main paths;

a switching circuit configured to include a plurality of weighted elements and a plurality of switching elements, wherein the plurality of weighted elements are respectively coupled to the preliminary path and the plurality of main paths, and the plurality of switching elements are respectively coupled to the plurality of weighted elements through the plurality of main paths;

a reference voltage setting circuit configured to receive an inverting voltage and a non-inverting voltage to generate an output voltage signal applied to gate terminals of the plurality of weighted elements in common, wherein the inverting voltage has a mean value of reference node voltages induced at the preliminary path and the main paths, and the non-inverting voltage corresponds to a reference voltage; and a current-to-voltage conversion circuit configured to generate a current flowing through at least one, which is coupled to a high input line, among the plurality of main paths of the R-2R ladder network and configured to convert the generated current into a voltage signal to output the voltage signal.

2. The digital-to-analog converter of claim 1,
wherein the plurality of main paths include a first main path to an $N^{th}$ main path (where, "N" denotes a natural number which is equal to or greater than four); and
wherein the R-2R ladder network further includes:
a first resistive portion having a first terminal coupled between a first basis node of the first basis node to an $(N-1)^{th}$ basis node and a first reference node of the first reference node to an $(N+1)^{th}$ reference node, wherein the first resistive portion provides the preliminary path and has an equivalent resistance value of '2R';
second to $N^{th}$ resistive portions having first terminals respectively coupled to the first to $(N-1)^{th}$ basis nodes and second terminals respectively coupled to the second to $N^{th}$ reference nodes, wherein the second to $N^{th}$ resistive portions respectively provide the first to $(N-1)^{th}$ main paths, and each of the second to $N^{th}$ resistive portions has an equivalent resistance value of '2R';
first to $(N-2)^{th}$ basis resistors coupled between the first to $(N-1)^{th}$ basis nodes sequentially disposed, wherein each of the first to $(N-2)^{th}$ basis resistors has an equivalent resistance value of 'R'; and
an $(N+1)^{th}$ resistive portion coupled between the $(N-1)^{th}$ basis node and the $(N+1)^{th}$ reference node, wherein the $(N+1)^{th}$ resistive portion provides the $N^{th}$ main path and has an equivalent resistance value of 'R'.

3. The digital-to-analog converter of claim 2, wherein the $(N-1)^{th}$ basis node is coupled to a ground voltage terminal.

4. The digital-to-analog converter of claim 1,
wherein the plurality of reference nodes include a first reference node to an $(N+1)^{th}$ reference node (where, "N" denotes a natural number which is equal to or greater than four);
wherein the plurality of main paths include a first main path to an $N^{th}$ main path; and
wherein the plurality of weighted elements include:
a first weighted element coupled between the first reference node and a first input line to constitute the preliminary path;
second to $(N+1)^{th}$ weighted elements respectively coupled to the second to $(N+1)^{th}$ reference nodes to constitute the first to $N^{th}$ main paths; and
first to $N^{th}$ switching elements respectively coupled in series to the second to $(N+1)^{th}$ weighted elements.

5. The digital-to-analog converter of claim 4, wherein the first and second weighted elements are realized using two NMOS transistors having substantially the same current drivability.

6. The digital-to-analog converter of claim 5,
wherein the first to $(N+1)^{th}$ weighted elements are realized using first to $(N+1)^{th}$ NMOS transistors, respectively; and
wherein $i^{th}$ NMOS transistor among the second to $(N+1)^{th}$ NMOS transistors is designed to have a current drivability which is twice a current drivability of an $(i-1)^{th}$ NMOS transistor among the second to $(N+1)^{th}$ NMOS transistors (where, "i" is a natural number which is greater than two and less than "(N+2)").

7. The digital-to-analog converter of claim 6, wherein source terminals of the first to $(N+1)^{th}$ NMOS transistors correspond to the first to $(N+1)^{th}$ reference nodes, respectively.

8. The digital-to-analog converter of claim 7,
wherein the reference voltage setting circuit includes a first operational amplifier; and
wherein the first operational amplifier includes:
an output terminal coupled to all of gate terminals of the first to $(N+1)^{th}$ NMOS transistors;
a non-inverting input terminal to which the reference voltage is applied; and
an inverting input terminal to which first to $(N+1)^{th}$ reference node voltages respectively induced at the first to $(N+1)^{th}$ reference nodes are separately applied.

9. The digital-to-analog converter of claim 8,
wherein the first operational amplifier further includes first to $(N+1)^{th}$ internal NMOS transistors having gate terminals to which the first to $(N+1)^{th}$ reference node voltages are respectively applied;
wherein all of drain terminals of the first to $(N+1)^{th}$ internal NMOS transistors are coupled to the output terminal; and
wherein all of source terminals of the first to $(N+1)^{th}$ internal NMOS transistors are coupled to one terminal of a current source.

10. The digital-to-analog converter of claim 9, wherein the first to $(N+1)^{th}$ internal NMOS transistors have substantially the same current drivability.

11. The digital-to-analog converter of claim 10, wherein the first operational amplifier further includes:
an $(N+2)^{th}$ internal NMOS transistor coupled to the non-inverting input terminal; and
a current mirror circuit coupled between the non-inverting input terminal and the output terminal.

12. The digital-to-analog converter of claim 1, wherein the current-to-voltage conversion circuit includes:
a current generation circuit configured to include a dummy current generation circuit supplying a dummy current to the switching circuit and a reference current generation circuit supplying a reference current to the switching circuit; and
an output circuit configured to output an analog voltage signal corresponding to the reference current.

13. The digital-to-analog converter of claim 12,
wherein the dummy current generation circuit includes a first PMOS transistor and a second operational amplifier; and
wherein the reference current generation circuit a second PMOS transistor and a third operational amplifier.

14. The digital-to-analog converter of claim 13,
wherein source terminals of the first and second PMOS transistors receive the reference voltage;

wherein a gate terminal of the first PMOS transistor is coupled to an output terminal of the second operational amplifier;

wherein a gate terminal of the second PMOS transistor is coupled to an output terminal of the third operational amplifier;

wherein a drain terminal of the first PMOS transistor is coupled to both a first input line connected to the switching circuit and a non-inverting input terminal of the second operational amplifier;

wherein a drain terminal of the second PMOS transistor is coupled to both a second input line connected to the switching circuit and a non-inverting input terminal of the third operational amplifier; and wherein an inverting input terminal of the second operational amplifier is directly coupled to an inverting input terminal of the third operational amplifier.

15. The digital-to-analog converter of claim 14, wherein the first input line splits into the preliminary path and a plurality of low input lines;

wherein the second input line splits into a plurality of high input lines; and wherein each of the plurality of switching elements performs a switching operation for electrically connecting one of the plurality of weighted elements to one of the low input lines or one of the high input lines, in response to any one of binary data of a digital input signal.

16. The digital-to-analog converter of claim 14, wherein the output circuit includes a third PMOS transistor and a load resistor; and wherein the second and third PMOS transistors constitute a current mirror circuit.

17. A digital-to-analog converter comprising:

a resistive ladder network including a plurality of paths corresponding to bit currents, respectively;

a switching circuit configured to include a plurality of weighted elements respectively coupled to the paths; and a reference voltage setting circuit coupled to the weighted elements and the paths, and configured to minimize a variation of threshold voltages of the weighted elements.

18. The digital-to=analog converter of claim 17, wherein threshold voltages of at least two of the weighted elements are different from each other.

19. The digital-to-analog converter of claim 17, wherein the reference voltage setting circuit minimizes the variation of the threshold voltages of the weighted elements by generating an output voltage based on reference node voltages induced at the paths and supplying an output voltage signal applied to gate terminals of the plurality of weighted elements in common.

20. The digital-to-analog converter of claim 19, wherein the output voltage signal is based on a mean value of the reference node voltages.

21. The digital-to-analog converter of claim 19, wherein the reference voltage setting circuit includes an operational amplifier configured to receive a reference voltage at a non-inverting input terminal and receive, at an inverting input terminal, the reference node voltages induced at the paths.

22. The digital-to-analog converter of claim 21, wherein the reference voltage is equal to an average voltage of the reference node voltages.

23. The digital-to-analog converter of claim 17, wherein the resistive ladder network includes a R-2R ladder network.

* * * * *